(12) United States Patent
Kitaoka et al.

(10) Patent No.: US 9,130,250 B2
(45) Date of Patent: Sep. 8, 2015

(54) PROCESS FOR PRODUCING METAMATERIAL

(71) Applicant: ASAHI GLASS COMPANY, LIMITED, Tokyo (JP)

(72) Inventors: Kenji Kitaoka, Tokyo (JP); Kazuhiko Niwano, Tokyo (JP)

(73) Assignee: ASAHI GLASS COMPANY, LIMITED, Tokyo (JP)

(*) Notice: Subject to any disclaimer, the term of this patent is extended or adjusted under 35 U.S.C. 154(b) by 55 days.

(21) Appl. No.: 13/740,960

(22) Filed: Jan. 14, 2013

(65) Prior Publication Data
US 2013/0141190 A1   Jun. 6, 2013

Related U.S. Application Data

(63) Continuation of application No. PCT/JP2011/066162, filed on Jul. 14, 2011.

(30) Foreign Application Priority Data

Jul. 15, 2010   (JP) .................. 2010-160956

(51) Int. Cl.
| | |
|---|---|
| *B05D 5/12* | (2006.01) |
| *C23C 14/00* | (2006.01) |
| *H01P 7/00* | (2006.01) |
| *B05D 3/00* | (2006.01) |
| *C23C 14/04* | (2006.01) |
| *C23C 14/22* | (2006.01) |
| *G02B 1/00* | (2006.01) |

(Continued)

(52) U.S. Cl.
CPC ............... *H01P 7/00* (2013.01); *B05D 3/002* (2013.01); *C23C 14/0005* (2013.01); *C23C 14/04* (2013.01); *C23C 14/225* (2013.01); *G02B 1/007* (2013.01); *H01P 11/008* (2013.01); *B05D 1/60* (2013.01); *B05D 5/12* (2013.01); *C23C 16/0254* (2013.01); *Y10T 156/10* (2015.01)

(58) Field of Classification Search
USPC .......................................... 427/58, 124, 248.1
See application file for complete search history.

(56) References Cited

U.S. PATENT DOCUMENTS

| 6,122,103 A | 9/2000 | Perkins et al. | |
|---|---|---|---|
| 7,138,288 B2 * | 11/2006 | Shioji et al. ............ | 438/50 |

(Continued)

FOREIGN PATENT DOCUMENTS

| CN | 101622557 A | 1/2010 |
|---|---|---|
| JP | 2003-502708 A | 1/2003 |

(Continued)

OTHER PUBLICATIONS

International Search Report received in PCT/JP2011/066162 dated Sep. 13, 2011.

*Primary Examiner* — Brian K Talbot
(74) *Attorney, Agent, or Firm* — Foley & Lardner LLP

(57) ABSTRACT

A process for producing a metamaterial excellent in productivity is provided. The present invention relates to a process for producing a metamaterial including an electromagnetic wave resonator resonating with an electromagnetic wave, the process including: vapor-depositing a material which can form the electromagnetic wave resonator to a support having a shape corresponding to a shape of the electromagnetic wave resonator to thereby arrange the electromagnetic wave resonator on the support.

8 Claims, 15 Drawing Sheets

(51) Int. Cl.
*H01P 11/00* (2006.01)
*B05D 1/00* (2006.01)
*C23C 16/02* (2006.01)

(56) References Cited

U.S. PATENT DOCUMENTS

| 8,197,887 | B1* | 6/2012 | Burckel | 427/97.7 |
| 2002/0014996 | A1* | 2/2002 | Keilen | 343/702 |

FOREIGN PATENT DOCUMENTS

| JP | 2006-350232 A | 12/2006 |
| JP | 2007-041243 A | 2/2007 |
| JP | 2009-046742 A | 3/2009 |
| JP | 2009-057518 A | 3/2009 |
| WO | WO-2008/084856 A1 | 7/2008 |
| WO | WO-2009/125827 A1 | 10/2009 |
| WO | WO-2010/036290 A2 | 4/2010 |

* cited by examiner (a)

(b)

(a)

(b)

ROTATION ANGLE OF POLARIZING PLATE (c)

ROTATION ANGLE OF SAMPLE (a)

(b)

(a)

(b)

(a)

(b)

(c)

(d)

(a)

(b)

(c)

(d)

(e)

(a) PLANE VIEW (b) FRONT VIEW (c) SIDE VIEW

A: RELATIVE PERMITTIVITY
B: RELATIVE PERMEABILITY

PROCESS FOR PRODUCING METAMATERIAL

TECHNICAL FIELD

The present invention relates to a process for producing a metamaterial and a metamaterial.

BACKGROUND ART

Hitherto technologies relating to a process for producing a metamaterial and a metamaterial have been disclosed.

For example, JP-A-2006-350232 (Patent Document 1) discloses a metamaterial including a plurality of at least either electric resonators or magnetic resonators smaller than a wavelength of light wave, which is arranged within only a predetermined plane. JP-A-2009-057518 (Patent Document 2) discloses a process for producing an anisotropic film, including a step of forming a metal nanostructure on a base material, a step of forming a resin film having the metal nanostructure embedded therein, and a step of peeling the resin film from the base material, wherein the step of forming a metal nanostructure on the base material includes at least a step of forming a coating film including a metal layer formed by electroless plating on a surface of a template arranged on the base material, and a step of removing a part or the whole of the template while leaving a part or the whole of the coating film.

PRIOR ART DOCUMENTS

Patent Documents

Patent Document 1: JP-A-2006-350232
Patent Document 2: JP-A-2009-057518

SUMMARY OF THE INVENTION

Problems that the Invention is to Solve

However, in the related art relating to the process for producing a metamaterial, since a lithography technology was used, there has been a problem that a metamaterial including an electromagnetic wave resonator fabrication is underproductive.

A purpose of the present invention is to provide a productive fabrication process for a metamaterial, and a metamaterial.

Means for Solving the Problems

The present invention provides the following process for producing a metamaterial, and a metamaterial.

(1) A process for producing a metamaterial comprising an electromagnetic wave resonator resonating with an electromagnetic wave, the process comprising: vapor-depositing a material which can form the electromagnetic wave resonator to a support having a shape corresponding to a shape of the electromagnetic wave resonator to thereby arrange the electromagnetic wave resonator on the support.

(2) The process for producing a metamaterial according to (1), wherein the material which can form the electromagnetic wave resonator is vapor-deposited by a physical vapor deposition to thereby arrange the electromagnetic wave resonator on the support.

(3) The process for producing a metamaterial according to (1) or (2), wherein the material which can form the electromagnetic wave resonator is vapor-deposited to the support from two or more different directions.

(4) The process for producing a metamaterial according to any one of (1) to (3), wherein the support has a shape having a convex curved surface corresponding to the shape of the electromagnetic wave resonator, and the material which can form the electromagnetic wave resonator is vapor-deposited to the convex curved surface of the support.

(5) The process for producing a metamaterial according to any one of (1) to (4), wherein a dielectric is vapor-deposited to the support, and a conductive material and/or a dielectric is further vapor-deposited thereto.

(6) The process for producing a metamaterial according to (5), wherein the support has a plurality of flat surfaces, and the plurality of flat surfaces have a difference in level each other.

(7) The process for producing a metamaterial according to any one of (1) to (6), wherein a material of the support is a material permeable to the electromagnetic wave.

(8) The process for producing a metamaterial according to (7), wherein the electromagnetic wave resonator which has been transferred to a material having adhesiveness is laminated, followed by integrating.

(9) The process for producing a metamaterial according to any one of (1) to (6), wherein the electromagnetic wave resonator which has been provided on the support is transferred to a material having adhesiveness, and then, the electromagnetic wave resonator is separated from the support to be thereby recovered.

(10) The process for producing a metamaterial according to any one of (1) to (6) and (9), wherein the electromagnetic wave resonator is dispersed in a liquid composed of a material to be a dielectric transparent to the electromagnetic wave after solidification or in a liquid comprising a material to be a dielectric transparent to the electromagnetic wave after solidification, followed by solidifying.

(11) A metamaterial, comprising: a support having a shape having a plurality of pillars; and an electromagnetic wave resonator which is arranged on the support, covers at least a part of the support with a material different from the support, and resonates with an electromagnetic wave,
wherein the electromagnetic wave resonator has an approximate opened quadrilateral shape or approximate U-shape, and the approximate opened quadrilateral shape or approximate U-shape has two end parts differing in length.

(12) A metamaterial, comprising: a support which has a different height, width and/or depth and has a shape having a plurality of pillars; and an electromagnetic wave resonator which is arranged on the support, covers at least a part of the support with a material different from the support, and resonates with an electromagnetic wave,
wherein the electromagnetic wave resonator has an approximate opened quadrilateral shape or approximate U-shape.

Advantages of the Invention

According to one aspect of the present invention, a process for producing a metamaterial more efficiently can be provided. In addition, by utilizing the advantage in the aspect, a metamaterial realizing a negative refraction index can be realized.

MODE FOR CARRYING OUT THE INVENTION

Figure 1:
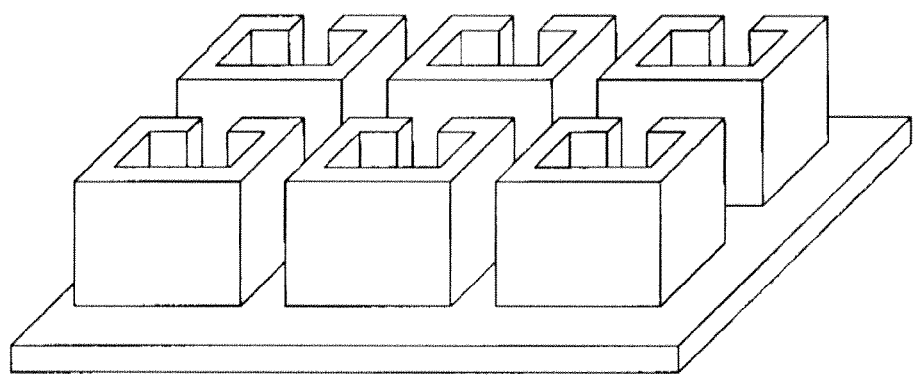
FIGS. 1(a) and (b) are views explaining a process for producing a metamaterial according to a first embodiment of the present invention.
Figure 1:
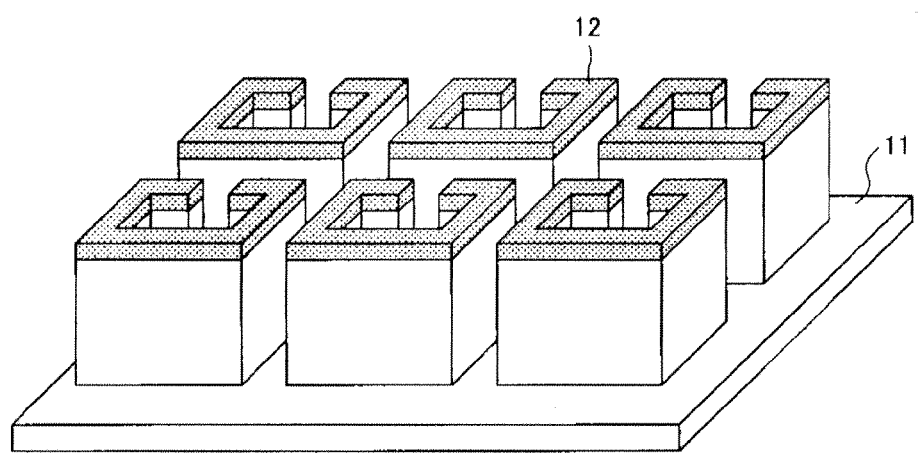

Next, embodiments of the present invention will be explained by referring to the drawings.

FIG. 1(a) and FIG. 1(b) show a view explaining a process for producing a metamaterial according to a first embodiment of the present invention. FIG. 1(a) is a view explaining a support in the process for producing a metamaterial according to the first embodiment of the present invention. FIG. 1(b) is a view explaining a metamaterial in the process for producing a metamaterial according to the first embodiment of the present invention.

The metamaterial means a material in which a unit particle composed of a structure such as a metal, a dielectric, a magnetic material, a semiconductor or a superconductor, which is equal to or smaller than a wavelength, is randomly dispersed in a dielectric or is regularly arranged, and can have various form as shown in the first to sixth embodiments and examples, which are described later.

Firstly, as shown in FIG. 1(a), in the process for producing the metamaterial according to the first embodiment of the present invention, a support 11 which supports an electromagnetic wave resonator resonating with an electromagnetic wave (hereinafter, may be simply referred to as "electromagnetic wave resonator") is prepared. The process for preparing the support 11 is not particularly limited, and the support 11 may be prepared by a nanoimprint method. In the nanoimprint method, the support 11 which is a cured product of a resin can be obtained by, for example, providing a layer of photocurable resin on a substrate, pressing a mold having an inverted pattern of the shape corresponding to the shape of the electromagnetic wave resonator to the layer of the photocurable resin, curing the photocurable resin in a state or pressing the mold to the layer of the photocurable resin to thereby obtain a cured product of the resin, and separating the cured product of the resin from the mold.

The support 11 has a shape corresponding to the shape of the electromagnetic wave resonator contained in the metamaterial. The shape of the support 11 corresponding to the shape of the electromagnetic wave resonator is a shape such that, when a material of the electromagnetic wave resonator is vapor-deposited to the support 11, the electromagnetic wave resonator formed by the vapor deposition resonates with an electromagnetic wave. The support 11 shown in FIG. 1(a) has a U-shape or opened quadrilateral shape corresponding to the cross-sectional shape of the electromagnetic wave resonator having a U-shape or a shape in which at least a part of the quadrilateral shape is opened (hereinafter referred to as opened quadrilateral shape).

A material of the support 11 is not particularly limited. When the support 11 is prepared by a nanoimprint method, the support is preferably composed of a resin obtained by curing a photocurable resin. Examples of the resin include resins described in, for example, WO 2006/114958, JP-A-2009-073873 and JP-A-2009-019174.

In the process for producing a metamaterial according to the first embodiment of the present invention, the material of the support 11 is preferably a material permeable to an electromagnetic wave of resonant frequency of an electromagnetic wave resonator. Examples of the material include a moldable ultraviolet-curing resin, a thermosetting resin and the like, and an acryl resin and a fluorine resin can be exemplified. Furthermore, a glass that can be subjected to transfer molding, silicon that can be subjected to fine processing by dry etching, ceramics to which a shape can be imparted by cast molding, and the like can be used as the support.

In this case, the metamaterial itself containing the support 11 and the electromagnetic wave resonator can be used as a functional element such an optical element without recovering the electromagnetic wave resonator from the support 11.

In the process for producing a metamaterial according to the first embodiment of the present invention, the support 11 is preferably composed of a resin. In this case, the support 11 having a shape corresponding to the shape of the electromagnetic wave resonator contained in the metamaterial can be easily prepared.

In the process for producing a metamaterial according to the first embodiment of the present invention, the resin constituting the support 11 is preferably a thermoplastic resin. In this case, the support 11 can be softened or melted more easily by heating the metamaterial. For this reason, the electromagnetic wave resonator can easily be recovered from the support 11.

In the process for producing a metamaterial according to the first embodiment of the present invention, the resin constituting the support 11 preferably contains a fluorine resin. The support 11 may be composed of a fluorine resin. Furthermore, the support 11 may be a support which is covered with a fluorine resin on a side to which a material of the electromagnetic wave resonator is vapor-deposited.

In this case, the support 11 contains a fluorine resin having higher hydrophobicity. Therefore, an electromagnetic wave resonator such as a conductive material or a dielectric can easily be recovered from the support 11.

As shown in FIG. 1(b), in the process for producing a metamaterial according to the first embodiment of the present invention, a material of the electromagnetic wave resonator 12 is vapor-deposited to the support 11 having a shape corresponding to the shape of the electromagnetic wave resonators 12. Thus, the electromagnetic wave resonators 12 are provided on the support 11. As a result, a metamaterial 13 containing the support 11 and the electromagnetic wave resonators 12 can be produced.

In the process for producing a metamaterial according to the first embodiment of the present invention, the electromagnetic wave may be any of an electromagnetic wave in a wavelength region of radio wave (electromagnetic wave having a wavelength longer than 10 mm), an electromagnetic wave in millimeter wave and terahertz wave (longer than 100 μm and 10 mm or shorter), an electromagnetic wave in a wavelength region of infrared light (electromagnetic wave having a wavelength longer than 780 nm, and 100 μm or shorter), an electromagnetic wave in a wavelength region of visible light (longer than 380 nm and 780 nm or shorter), and an electromagnetic wave having a wavelength of an ultraviolet (longer than 10 nm and 380 nm or shorter) in a wavelength region of ultraviolet light.

The electromagnetic wave resonators 12 have a shape constituting a kind of LC circuit. As shown in FIG. 1(h), in the process for producing a metamaterial according to the first embodiment of the present invention, the shape of the electromagnetic wave resonators 12 is a shape having an approximate U-shape or approximate opened quadrilateral shape in cross-section. Thus, the shape of the electromagnetic wave resonators 12 has surfaces facing each other through a gap such that the electromagnetic wave resonators 12 have capacitance. The electromagnetic wave resonators 12 shown in FIG. 1(b) have a gap between both end parts of the approximate U-shape or approximate opened quadrilateral shape. The shape of the electromagnetic wave resonators 12 has a structure capable of forming a loop by conduction current and displacement current such that the electromagnetic wave resonators 12 have inductance. The electromagnetic wave resonators 12 shown in FIG. 1(b) have the structure capable of forming a loop by conduction current flowing from one end part of the approximate U-shape or approximate opened quadrilateral shape to the other end part thereof and displacement current generated in a gap between both end parts of the approximate U-shape or approximate opened quadrilateral shape.

The electromagnetic wave resonators 12 shown in FIG. 1(b) have an approximate U-shape or approximate opened quadrilateral shape (Split Ring Resonator (SRR)), but an electromagnetic wave resonator having a shape of a combination of two U-shaped parts each having an opening at a side opposite each other, as disclosed in, for example, JP-A-2006-350232 may be used as an electromagnetic wave resonator having another shape.

The approximate U-shaped or approximate opened quadrilateral shaped electromagnetic wave resonator causes magnetic resonance and electric resonance with increasing a frequency, and permeability and permittivity show a negative value in a high frequency band just after the respective resonance frequencies. In this case, in the case where the electromagnetic wave resonator has a symmetrical shape, the frequencies that permittivity and permeability show a negative value respectively differ.

However, the present inventors have found that, as aspects in the case where the electromagnetic wave resonator is SRR, out of the approximate U-shape or approximate opened quadrilateral shape, when the length of one end part of two end parts that the approximate U-shape or approximate opened quadrilateral shape has is longer than that of the other end part thereof, thus making asymmetric, permittivity and permeability show negative values in a specific frequency hand, and negative refractive index can be realized.

In other words, by making the length of the end part at one side of the approximate U-shaped or approximate opened quadrilateral shaped electromagnetic wave resonator longer than that of the end part at the other side thereof, frequency of electric resonance can be shifted to low frequency. Therefore, by adjusting the length of the end part at one side thereof, both permeability and permittivity can have negative values in the same frequency band, and negative refractive index can be realized at the same frequency hand.

It has been found in other embodiment that by arranging a plurality of supports having different height, width and/or depth by nanoimprint and changing height, width and/or depth of the electromagnetic wave resonators, the refractive index in a certain frequency band can be made negative.

That is, in the present invention, the metamaterial having the following features is preferable.

(i) A metamaterial, including: a support having a shape having a plurality of pillars; and an electromagnetic wave resonator which is arranged on the support, covers at least a part of the support with a material different from the support, and resonates with an electromagnetic wave, wherein the electromagnetic wave resonator has an approximate opened quadrilateral shape or approximate U-shape, and the approximate opened quadrilateral shape or approximate U-shape has two end parts differing in length.

(ii) A metamaterial, including: a support which has a different height, width and/or depth and has a shape having a plurality of pillars; and an electromagnetic wave resonator which is arranged on the support, covers at least a part of the support with a material different from the support, and resonates with an electromagnetic wave, wherein the electromagnetic wave resonator has an approximate opened quadrilateral shape or approximate U-shape.

In the above metamaterial (i), the term "two end parts differing in length" means that, in the case of the approximate opened quadrilateral shaped electromagnetic wave resonator, when two end parts of the approximate opened quadrilateral shape are designated as starting points, the lengths, on a side, of the parts along the shape of the approximate opened quadrilateral shape from the starting points are different from each other; and in the case of the approximate U-shaped electromagnetic wave resonator, the lengths from the top part of U-shape to each end parts are different.

Figure 15:
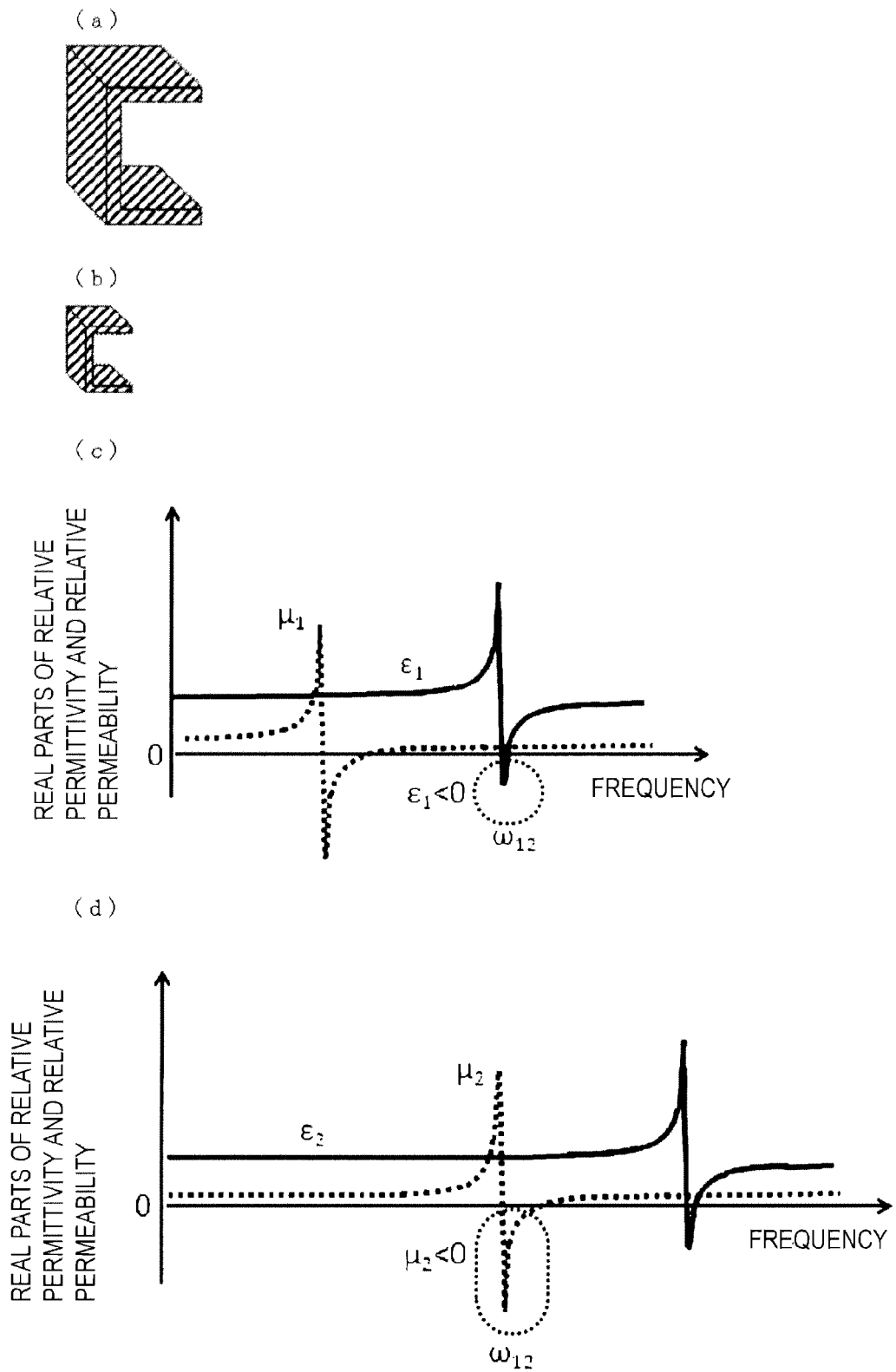
FIGS. 15(a) to (d) are views explaining frequency dependency of permittivity and permeability of electromagnetic wave resonators having different height, width and/or depth according to the embodiments of the present invention.

FIGS. 15(a) to (d) are views explaining frequency dependency of permittivity and permeability of electromagnetic wave resonators having different height, width and depth, that is, electromagnetic wave resonators having different size. FIG. 15(a) and FIG. 15(b) are view explaining electromagnetic wave resonators (supports are omitted) having a certain size A and another size B, respectively. FIG. 15(c) and FIG. 15(d) are views explaining frequency dependency of real parts of permittivity and permeability of the electromagnetic wave resonators shown in FIG. 15(a) and FIG. 15(b), respectively.

In the electromagnetic wave resonators of FIG. 15(a) and FIG. 15(b), the permittivities are $\in_1$ and $\in_2$, respectively. In the electromagnetic wave resonators of FIG. 15(a) and FIG. 15(b), the permeability are $\mu_1$ and $\mu_2$, respectively.

In the electromagnetic wave resonator having a certain size A shown in FIG. 15(a), a frequency band in which the permittivity $\in_1$ is negative and a frequency band in which the permeability $\mu_1$ is negative are generally different.

However, by combining the electromagnetic wave resonator having a certain size A with the electromagnetic wave resonator having another size B in which the permeability is negative at a frequency band $\omega_{12}$ in which the permittivity is negative, as shown in FIG. 15(c), the refractive index in the frequency band $\omega_{12}$ can be negative (both the permittivity $\in_1$ of the electromagnetic wave resonator A and the permeability $\mu_2$ of the electromagnetic wave resonator B are negative).

If a refractive index can be negative, as the effects caused thereby, in the case of preparing a lens, light can be narrowed down exceeding diffraction limit, and an object lower than wavelength order can be recognized as an optical image. In addition, if an object is wrapped with a sheet using a material having a negative refractive index, a transparent cloak in which electromagnetic wave passes through the sheet and bypasses the substance, and the phenomena of cloaking become possible.

The material of the electromagnetic wave resonators 12 is preferably a conductive material such as a metal or a conductive compound. Examples of the conductive material include metals such as aluminum, copper, silver and gold; and low resistance carbon such as graphene. The material of the electromagnetic wave resonators 12 may be a dielectric. Examples of the dielectric include (relative permittivity: 3.7), $Ta_2O_5$ (relative permittivity: 29) and $BaTiO_3$ (relative permittivity: 100).

In the process for producing a metamaterial according to the first embodiment of the present invention, the material of the electromagnetic wave resonators 12 is preferably a dielectric. In this case, loss of an electromagnetic wave with high frequency passing through the metamaterial 13 containing the electromagnetic wave resonators 12 can be reduced.

In the process for producing a metamaterial according to the first embodiment of the present invention, the material of the electromagnetic wave resonators 12 is preferably a conductive material. In this case, reverse magnetic field formed by the electromagnetic wave resonators 12 is stronger. Therefore, relative permeability, refractive index and dispersion of the metamaterial 13 can further effectively be controlled.

The action of the electromagnetic wave resonators 12 is described below. It is considered that when an electromagnetic wave with resonance frequency of an electromagnetic wave resonator enters the electromagnetic wave resonators 12, magnetic field of electromagnetic wave periodically fluctuating with time generates conduction current and displacement current in the electromagnetic wave resonators 12 according to Faraday's law of electromagnetic induction. At this time, it is considered that the conduction current and displacement current generated in the electromagnetic wave resonators 12 weaken magnetic field of an electromagnetic wave periodically fluctuating with time according to Faraday's law of electromagnetic induction. It is considered that the conduction current and displacement current generated in the electromagnetic wave resonators 12 form reverse magnetic field weakening magnetic field of an electromagnetic wave which has entered the electromagnetic wave resonators 12 according to Ampere's law. As a result, it is considered that the electromagnetic wave resonators 12 change relative permeability of the metamaterial 13 to an electromagnetic wave with resonance frequency of the electromagnetic wave resonators 12. The refractive index of the metamaterial 13 to an electromagnetic wave with resonance frequency of the electromagnetic wave resonators 12 depends on the relative permeability of the metamaterial 13 to an electromagnetic wave with resonance frequency of the electromagnetic wave resonators 12. For this reason, it is considered that the electromagnetic wave resonators 12 change the refractive index (dispersion) of the metamaterial 13 to an electromagnetic wave with resonance frequency of the electromagnetic wave resonators 12.

Energy of the magnetic field of an electromagnetic wave, which enters the electromagnetic wave resonators 12, is reduced by the reverse magnetic field formed by the electromagnetic wave resonators 12. Therefore, it is considered that the electromagnetic wave resonators 12 absorb at least a part of energy of an electromagnetic wave with resonance frequency. Thus, properties of resonance of the electromagnetic wave resonators 12 to an electromagnetic wave with a certain specific frequency (resonance frequency of electromagnetic wave resonator) can be evaluated by absorption of an electromagnetic wave due to the shape of an electromagnetic wave resonator at a certain specific frequency.

A method for evaluating properties of resonance of the electromagnetic wave resonators 12 to an electromagnetic wave with a certain specific frequency is described below.

Figure 2:
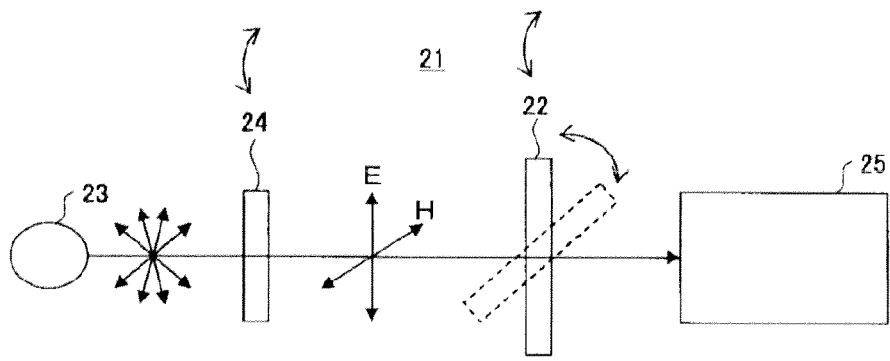
FIGS. 2(a) to (c) are views explaining a process for evaluating properties of resonance of an electromagnetic wave resonator to an electromagnetic wave having a certain specific frequency.
Figure 2:
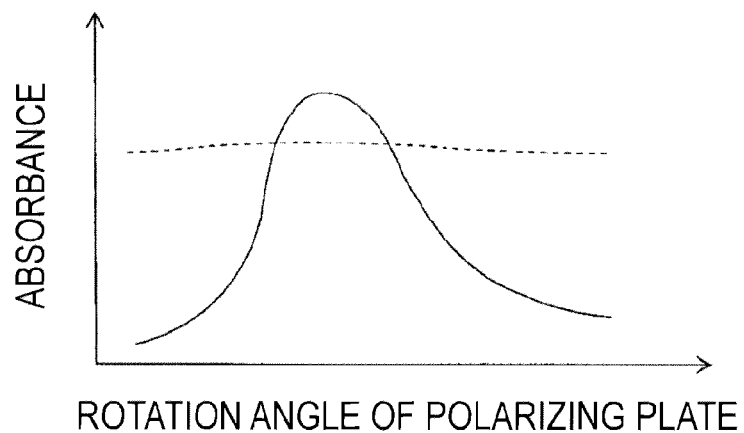
Figure 2:
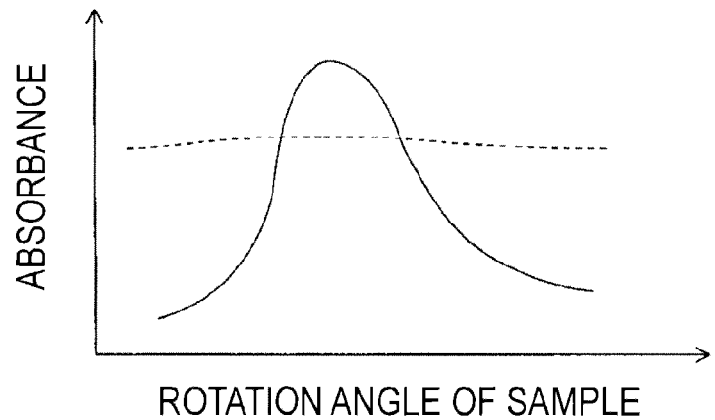

FIGS. 2(a) to (c) are views explaining a method for evaluating properties of resonance of an electromagnetic wave resonator to an electromagnetic wave with a certain specific frequency. FIG. 2(a) is a view explaining an apparatus for evaluating properties of resonance of an electromagnetic wave resonator to an electromagnetic wave with a certain specific frequency.

As shown in FIG. 2(a), an apparatus 21 for evaluating properties of resonance of a sample 22 containing the electromagnetic wave resonators 12 includes a light source 23, a polarizing plate 24 and a spectrophotometer 25. In the apparatus 21, the light source 23 emits non-polarized white light. The non-polarized white light emitted from the light source 23 passes through the polarizing plate 24. The white light passing through the polarizing plate 24 is linearly polarized light. The linearly polarized white light enters the sample 22. Out of the linearly polarized white light entering the sample 22, when the linearly polarized light of resonance frequency resonates with the electromagnetic wave resonators 12 contained in the sample 22, the linearly polarized light of resonance frequency is absorbed by the electromagnetic wave resonators 12 contained in the sample 22. Absorbance of the linearly polarized light passing through the sample 22 to various wavelengths in white light is measured using the spectrophotometer 25.

Absorbance of particles in the sample 22 to the wavelength of the linearly polarized light is similarly obtained using (substantially) spherical particles prepared by the same material as the material of the electromagnetic wave resonators 12, in place of the electromagnetic wave resonators 12. In the case where significant difference is observed between the absorbance of the electromagnetic wave resonators 12 in the sample 22 and the absorbance of the particles in the sample 22, it is judged that the electromagnetic wave resonators 12 is an electromagnetic wave resonator that resonates, different from simple particles, with an electromagnetic wave.

Whether the electromagnetic wave resonators are randomly arranged in the sample or regularly arranged therein can be examined using the apparatus 21 shown in FIG. 2(a).

The apparatus 21 preferably has at least one of the means for rotating the sample 22 and the means for rotating the polarizing plate 24.

After measuring the absorbance of the sample containing the electromagnetic wave resonators by changing a wavelength, a wavelength at which the absorption becomes peak is identified. The wavelength of non-polarized white light emitted from the light source 23 is fixed to the identified wavelength, the polarizing plate is rotated or the sample is rotated, and change in absorbance is observed. The change in absorbance is observed by rotating the sample 22 as shown by a solid line and a broken line, and additionally rotating in H direction. The polarizing plate 24 is rotated in H direction, and change in absorbance is observed. FIG. 2(b) is a view explaining change in absorbance of an electromagnetic wave resonator in the case where a polarizing plate is rotated, and FIG. 2(c) is a view explaining change in absorbance of an electromagnetic wave resonator in the case where a sample is rotated.

In the case where the electromagnetic wave resonators 12 in the sample 22 are regularly arranged, the absorbance of linearly polarized light due to the electromagnetic wave resonators 12 contained in the sample 22 depends on an angle between a direction of the linearly polarized light and a direction of regular arrangement of the electromagnetic wave resonators. For this reason, when the polarizing plate 24 is rotated as shown by a solid line in FIG. 2(b), the absorbance of light due to the electromagnetic wave resonators 12 contained in the sample 22 fluctuates. Furthermore, when the sample 22 is rotated by the means for rotating the sample 22 as shown by a solid line in FIG. 2(c), the absorbance of light due to the electromagnetic wave resonators 12 contained in the sample 22 fluctuates.

In the case where the electromagnetic wave resonators 12 in the sample 22 are randomly arranged, even though the polarizing plate is rotated as shown by the dot line in FIG. 2(b), absorption of light due to the electromagnetic wave resonators 12 contained in the sample 22 does not depend on the rotation of the polarizing plate. Furthermore, even though the sample 22 is rotated by the means for rotating the sample 22 as shown by the dot line in FIG. 2(c), absorption of light due to the electromagnetic wave resonators 12 contained in the sample 22 does not depend on the rotation of the sample 22.

The electromagnetic wave resonators 12 as shown in FIG. 1(b) may be a fine electromagnetic wave resonator having a size of approximately millimeter or less. In this case, resonance frequency of the electromagnetic wave resonators 12 generally falls within a region of frequency of visible light. For this reason, relative permeability/refractive index/dispersion of the metamaterial 13 to a wavelength of visible light can be controlled.

In the first embodiment of the present invention shown in FIG. 1(b), the electromagnetic wave resonators 12 are regularly arranged in the metamaterial 13. However, the electromagnetic wave resonators 12 are sometimes irregularly (randomly) arranged in the metamaterial 13. In the case where the electromagnetic wave resonators 12 are irregularly (randomly) arranged in the metamaterial 13, for example, the metamaterial 13 having physical properties (for example, relative permeability, refractive index and dispersion) that are isotropic to a direction of polarization of an electromagnetic wave can be provided.

Next, examples of the method for vapor-depositing the material of the electromagnetic wave resonators 12 to the support 11 include physical vapor deposition (PVD) and chemical vapor deposition (CVD).

The physical vapor deposition is means of heating a raw material in a solid state by which the raw material vaporizes and depositing a gas of the vaporized raw material on the surface of a substrate. Examples of the physical vapor deposition include vacuum vapor deposition, sputtering and ion plating. Examples of the vacuum vapor deposition include electron beam deposition and resistance heating deposition. Examples of the sputtering include direct current (DC) sputtering, alternate current (AC) sputtering, radio-frequency (RF) sputtering, pulsed direct current (DC) sputtering and magnetron sputtering.

The chemical vapor deposition is the means of supplying a raw material gas containing components of an objective thin film and depositing a film by a chemical reaction on a substrate surface or in a gas phase. Examples of the chemical vapor deposition include thermal CVD, light CVD, plasma CVD and epitaxial CVD.

In the process for producing a metamaterial according to the first embodiment of the present invention, the electromagnetic wave resonators 12 having a given shape can be formed on the support 11 without conducting specific treatment (etching, ashing, lift-off or the like) before and after vapor deposition of a material of the electromagnetic wave resonators 12 to the support 11 having a shape corresponding to the shape of the electromagnetic wave resonators 12.

Therefore, according to the first embodiment of the present invention, a process for producing a metamaterial, capable of easily producing the metamaterial 13 containing the electromagnetic wave resonators 12 can be provided.

In the process for producing a metamaterial according to the first embodiment of the present invention, the material of the electromagnetic wave resonators 12 is preferably vapor-deposited by the means of physical vapor deposition. In this case, the electromagnetic wave resonators 12 can be provided on the support 11 without using a chemical reaction of a material of the electromagnetic wave resonators 12. As a result, uniform electromagnetic wave resonators 12 can be provided on the support 11.

As shown in FIG. 1(b), in the process for producing a metamaterial according to the first embodiment of the present invention, the support 11 preferably includes convex portions having a shape containing a flat surface corresponding to the shape of electromagnetic wave resonators 12.

The material of the electromagnetic wave resonators 12 can be vapor-deposited to the support 11 from a direction oblique to a normal line of a flat surface of the support 11.

For example, a supply source of the material of the electromagnetic wave resonators 12 is arranged in a direction oblique to a normal line of a flat surface of the convex portion of the support 11. The material of the electromagnetic wave resonators 12 supplied from the supply source of the material of the electromagnetic wave resonators 12 is vapor-deposited to a flat surface of the convex portion of the support 11.

In this case, vapor deposition of the material of the electromagnetic wave resonators 12 to the surface (side surface and the like) of the support 11 other than the flat surface of the convex portion of the support 11 can be controlled by changing a direction of arranging a supply source of the material of the electromagnetic wave resonators 12. Furthermore, the material of the electromagnetic wave resonators 12 can be vapor-deposited to the support from at least two different directions.

Figure 3:
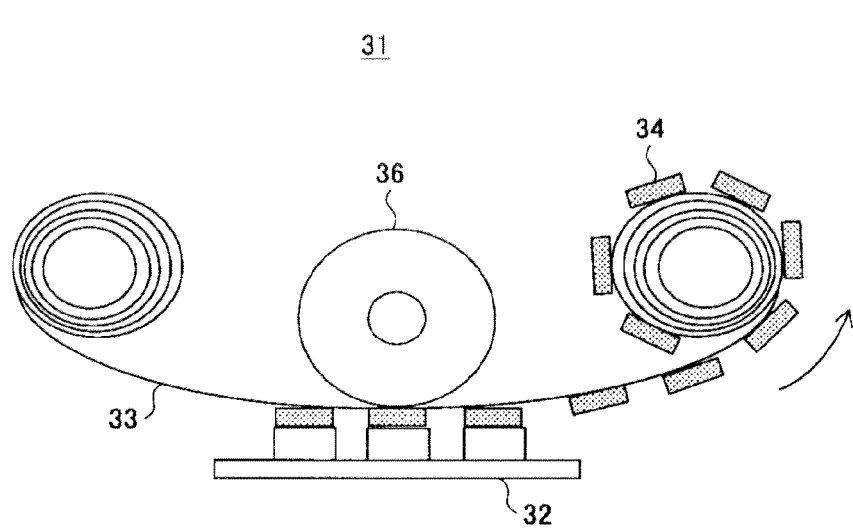
FIGS. 3(a) and (b) are views explaining a process for producing a metamaterial according to a second embodiment of the present invention.
Figure 3:
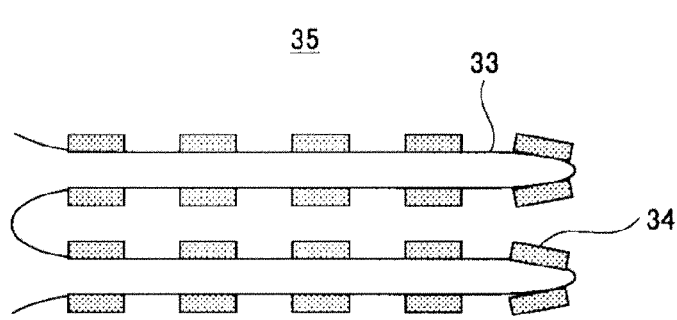

FIGS. 3(a) and (h) are views explaining a process for producing a metamaterial according to a second embodiment of the present invention. FIG. 3(a) is a view showing an apparatus for producing a metamaterial in the process for producing a metamaterial according to the first embodiment of the present invention. FIG. 3(h) is a view showing a metamaterial produced by the process for producing a metamaterial according to the first embodiment of the present invention.

The process for producing a metamaterial according to the second embodiment of the present invention as shown in FIGS. 3(a) and (b) is preferably a process of transferring electromagnetic wave resonators 34 which resonates with an electromagnetic wave and is provided on a support 32 to a material 33 having adhesiveness. The electromagnetic wave resonators 34 provided on the support 32 may be, for example, the electromagnetic wave resonators 12 provided on the support 11 in the process for producing a metamaterial according to the first embodiment of the present invention.

The material 33 having adhesiveness may be a material having viscoelasticity. Examples of the material having viscoelasticity include a silicone rubber.

The process of transferring the electromagnetic wave resonators 34 provided on the support 32 to the material 33 having adhesiveness uses, for example, an apparatus 31 for producing a metamaterial as shown in FIG. 3(a). In the apparatus 31 for producing a metamaterial, a sheet of the material 33 having adhesiveness is pressed to the electromagnetic wave resonators 34 provided on the support 32 using a pressure roller 36. By this, the electromagnetic wave resonators 34 provided on the support 32 can be transferred to the sheet of the material 33 having adhesiveness. As a result, a metamaterial 35 including the sheet of the material 33 having adhesiveness and the electromagnetic wave resonators 34 transferred to the sheet, as shown in FIG. 3(b), is obtained. As shown in FIG. 3(a), the sheet (metamaterial 35) of the material 33 having adhesiveness, to which the electromagnetic wave resonators 34 have been transferred, is wound up.

According to the second embodiment of the present invention, the metamaterial 35 including the sheet of the material 33 having adhesiveness and the electromagnetic wave resonators 34 transferred to the sheet can easily be produced.

The metamaterial containing the electromagnetic wave resonator can further efficiently be produced by repeatedly or continuously conducting to provide the electromagnetic wave resonators to the support and to recover the electromagnetic wave resonator from the support. Furthermore, a bulk-shaped metamaterial can be produced by laminating the metamaterials 35, and then, integrating them.

In the process for producing a metamaterial according to the second embodiment of the present invention, the sheet of the material 33 having adhesiveness is preferably a material permeable to an electromagnetic wave with resonance frequency of the electromagnetic wave resonators 34. In this case, the metamaterial 35 itself containing the sheet of the material 33 having adhesiveness and the electromagnetic wave resonators 34 can be used as a functional element such as an optical element without recovering the electromagnetic wave resonators 34 from the sheet of the material 33 having adhesiveness.

Figure 4:
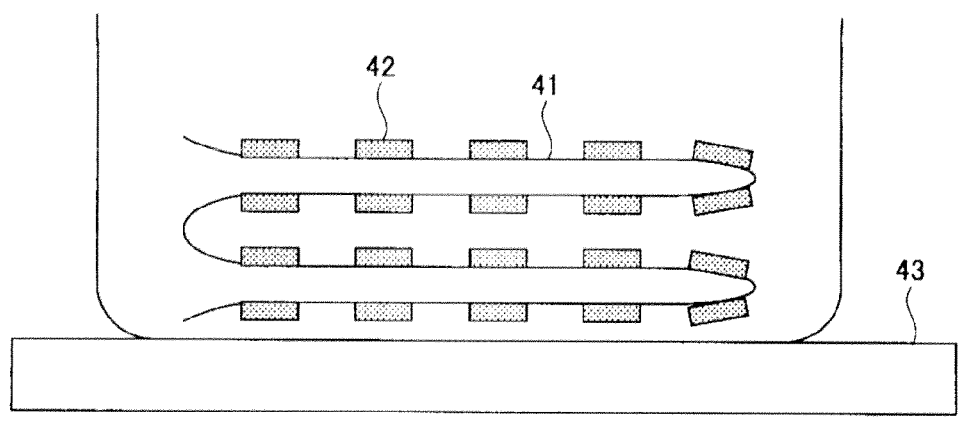
FIG. 4 is a view explaining a process for producing a metamaterial according to a third embodiment of the present invention.

FIG. 4 is a view explaining a process for producing a metamaterial according to a third embodiment of the present invention.

As shown in FIG. 4, the process for producing a metamaterial according to a third embodiment of the present invention includes melting a material 41 having adhesiveness, to which electromagnetic wave resonators 42 resonating with an electromagnetic wave have been transferred, thereby dispersing the electromagnetic wave resonators 42 in the molten material 41 having adhesiveness, and solidifying the molten material 41 having adhesiveness, in which the electromagnetic wave resonators 42 are dispersed.

According to the third embodiment of the present invention, a metamaterial including the solidified material 41 having adhesiveness and the electromagnetic wave resonators 42 dispersed therein can easily be produced.

In the process for producing a metamaterial according to the third embodiment of the present invention, the material 41 having adhesiveness is preferably a sheet of a thermoplastic resin. The sheet of a thermoplastic resin having the electromagnetic wave resonators 42 transferred thereto is heated using a heater 43 or the like. By melting the sheet of a thermoplastic resin, the electromagnetic wave resonators 42 can be dispersed in the molten thermoplastic resin. The thermoplastic resin is then solidified by cooling the molten thermoplastic resin having the electromagnetic wave resonators 42 dispersed therein. As a result, a metamaterial including the thermoplastic resin and the electromagnetic wave resonators 42 dispersed therein is obtained.

When the sheet of the thermoplastic resin having the electromagnetic wave resonators 42 transferred thereto is heated, the molten thermoplastic resin having the electromagnetic wave resonators 42 dispersed therein may be kneaded. In this case, the electromagnetic wave resonators 42 can randomly be dispersed in the molten thermoplastic resin. The thermoplastic resin is then solidified by cooling the molten thermoplastic resin having the electromagnetic wave resonators 42 dispersed randomly therein. As a result, a metamaterial including the electromagnetic wave resonators 42 dispersed randomly in the thermoplastic resin is obtained.

Figure 5:
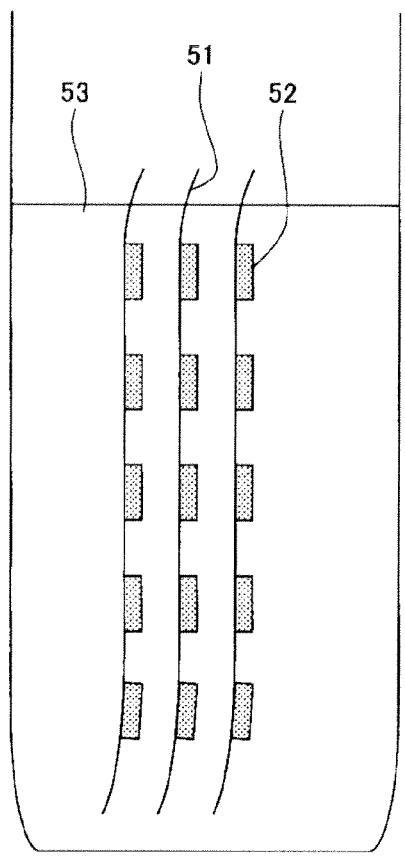
FIGS. 5(a) and (b) are views explaining a process for producing a metamaterial according to a fourth embodiment of the present invention.
Figure 5:
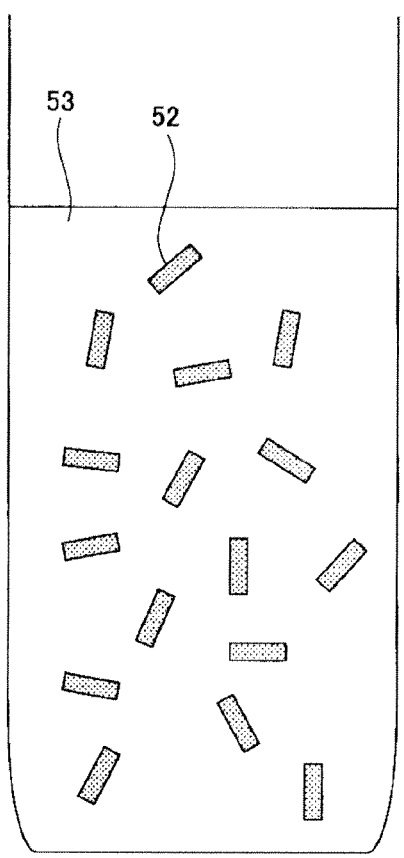

FIGS. 5(a) and (b) are views explaining a process for producing a metamaterial according to a fourth embodiment of the present invention. FIG. 5(a) is a view showing a first step in the process for producing a metamaterial according to the fourth embodiment of the present invention. FIG. 5(b) is a view showing a second step in the process for producing a metamaterial according to the fourth embodiment of the present invention. As shown in FIG. 5(b), electromagnetic wave resonators may be separated from a support. The separation may be conducted in a liquid.

The process for producing a metamaterial according to the fourth embodiment of the present invention as shown in FIGS. 5(a) and (b) includes dipping a material 51 having adhesiveness, to which electromagnetic wave resonators 52 resonating with an electromagnetic wave have been transferred, in a dielectric 53, thereby eliminating the electromagnetic wave resonators 52 from the material 51 having adhesiveness and dispersing the electromagnetic wave resonators 52 in a dielectric 53. The dielectric is preferably a liquid state. In the case where the dielectric is a resin or the like, if the resin has a viscosity such that the electromagnetic wave resonators can sufficiently be dispersed therein, the resin can be used as it is. Furthermore, the resin can be used by melting the same to decrease its viscosity.

According to the fourth embodiment of the present invention, a metamaterial including the electromagnetic wave resonators 52 dispersed in the dielectric 53 can easily be produced.

The dielectric 53 is preferably a solvent capable of dissolving the material 51 having adhesiveness. A solution of the material 51 having adhesiveness can be obtained by using the solvent as the dielectric 53. Examples of the solvent include organic solvents such as alcohols, and hydrocarbons such as toluene and tetradecane.

In the process for producing a metamaterial according to the fourth embodiment of the present invention, the dielectric 53 preferably contains a dispersant that improves dispersibility of the electromagnetic wave resonators 52. Sometimes the dispersant is a charge-controlling agent that controls charges of the electromagnetic wave resonators 52.

For example, in the case where a metal material is used as the material of the electromagnetic wave resonators 52, the dispersant is preferably a compound containing a hetero atom having non-covalent electron pair, such as nitrogen atom, sulfur atom or oxygen atom. Examples thereof include dispersants described in, for example, WO2004/110925 and JP-A-2008-263129.

Furthermore, for example, in the case where a dielectric is used as the material of the electromagnetic wave resonators 52, examples of the dispersant include polyacrylic acid, amines, thiols, amino acid and sugars.

In the case where the dielectric 53 contains the dispersant that improves dispersibility of the electromagnetic wave resonators 52, agglomeration of the electromagnetic wave resonators 52 in the dielectric 53 can be reduced. As a result, a metamaterial including and the electromagnetic wave resonators 52 more uniformly dispersed in the dielectric 53 is obtained.

In the process for producing a metamaterial according to the fourth embodiment of the present invention, the electromagnetic wave resonators are preferably solidified after dispersing in a liquid composed of a material becoming a transparent dielectric to an electromagnetic wave after solidification, or in a liquid including a material becoming a transparent dielectric to an electromagnetic wave after solidification. Examples of the material becoming a transparent dielectric to an electromagnetic wave after solidification include a curable resin and a glass as described hereinafter. In the case where the material becoming a transparent dielectric to an electromagnetic wave after solidification is a curable resin, the term "after solidification" means "after curing".

In the process for producing a metamaterial according to the fourth embodiment of the present invention, the dielectric 53 is preferably a curable component.

In the case where the dielectric 53 is a curable component, it becomes possible to cure the dielectric 53. As a result, a metamaterial including the electromagnetic wave resonators 52 dispersed in the dielectric 53 can be cured.

The process for producing a metamaterial according to the fourth embodiment of the present invention preferably includes curing the curable component having the electromagnetic wave resonators 52 dispersed therein. To achieve this, the curable component is irradiated with light or heated. As a result, a metamaterial including the electromagnetic wave resonators 52 dispersed in a cured product obtained by curing the curable component is obtained.

The curable component can be any component so long as it is a component becoming a cured product after curing by a polymerization reaction. Radical polymerization type curable resins, cationic polymerization type curable resins and radical polymerization type curable compounds (monomers) can be used without particular limitation. Those may be photo-curable and may be heat-curable, and are preferably photo-curable.

Examples of the radical polymerization type curable resins include resins having a group having a carbon-carbon unsaturated double bond, such as (meth)acryloyloxy group, (meth) acryloylamino group, (meth)acryloyl group, allyloxy group, allyl group, vinyl group or vinyloxy group. Examples of the resins include acrylic polymers having (meth)acryloyioxy group in a side chain thereof.

Examples of the cationic polymerization type curable resin include epoxy resins. Examples of the epoxy resins include hydrogenated bisphenol A epoxy resin, and 3,4-epoxycyclohexenylmethyl-3',4'-epoxycyclohexene carboxylate.

Examples of the radical polymerization type curable compounds (monomers) include compounds having a group having a carbon-carbon unsaturated double bond, such as (meth)acryloyloxy group, (meth)acryloylamino group, (meth) acryloyl group, allyloxy group, allyl group, vinyl group or vinyloxy group. The group having a carbon-carbon unsaturated double bond is preferably (meth)acryloyloxy group. The number of the carbon-carbon unsaturated double bond in those compounds is not particularly limited, and may be 1 and may be 2 or more.

Examples of those curable compounds include fluoro (meth)acrylates, fluorodienes, fluorovinylethers, fluorocyclic monomers, (meth)acrylates of monohydroxy compounds, mono(meth)acrylates of polyhydroxy compounds, and urethane (meth)acrylates obtained using polyether polyol. Those are used alone, and may be used by appropriately combining at least one kind selected from those. Those curable components preferably contain an appropriate polymerization initiator.

In the case where the curable component is a photocurable component, the dielectric 53 can further easily be cured by irradiating the dielectric 53 with light. As a result, a metamaterial including the electromagnetic wave resonators 52 dispersed in the dielectric 53 can further easily be cured.

In the process for producing a metamaterial according to the fourth embodiment of the present invention, the resin cured product obtained by curing the curable component is preferably permeable to an electromagnetic wave.

In this case, a metamaterial itself containing the resin obtained by curing the curable component and the electromagnetic wave resonators 52 can be used as a functional element such as an optical element.

In the process for producing a metamaterial according to the fourth embodiment of the present invention, the dielectric 53 is preferably a glass.

In the case where the dielectric 53 is a glass, a metamaterial including the electromagnetic wave resonators 52 dispersed in the glass can be provided.

The process for producing a metamaterial according to the fourth embodiment of the present invention preferably includes solidifying raw materials of a glass in a molten state, in which the electromagnetic wave resonators 52 are dispersed. This can be carried out by melting glass raw materials after dispersing the electromagnetic wave resonators in raw materials of a glass, followed by cooling, or by dispersing the electromagnetic wave resonators in molten glass raw materials, followed by cooling.

In this case, a metamaterial including the electromagnetic wave resonators 52 dispersed in the glass obtained by solidifying glass raw materials can be provided.

In the process for producing a metamaterial according to the fourth embodiment of the present invention, the glass is preferably a low melting point glass and a phosphate glass. The low melting point glass is a glass having a yield point of 550° C. or lower. Example of the low melting point glass includes a lead-free low melting point glass described in, for example, JP-A-2007-269531.

In the case where the glass is a low melting point glass, raw material of the glass can be melted at a relatively low temperature. For this reason, a metamaterial including the electromagnetic wave resonators 52 dispersed in the glass at a relatively low temperature can be provided.

When the raw materials of the low melting point glass in a molten state are cooled, a metamaterial including the electromagnetic wave resonators 52 dispersed in the low melting point glass can be provided.

In the process for producing a metamaterial according to the fourth embodiment of the present invention, a sol containing the electromagnetic wave resonators 52 resonating with an electromagnetic wave by dispersing the electromagnetic wave resonators 52 in the dielectric 53 is preferably obtained.

In this case, a metamaterial of a sol including the electromagnetic wave resonators 52 dispersed in the dielectric 53 can be provided.

The process for producing a metamaterial according to the fourth embodiment of the present invention preferably includes solidifying a sol containing electromagnetic wave resonators resonating with an electromagnetic wave. In this case, a metamaterial of a gel including the electromagnetic wave resonators 52 dispersed in the dielectric 53 can be provided.

To solidify a sol containing the electromagnetic wave resonators resonating with an electromagnetic wave, for example, the sol containing the electromagnetic wave resonators resonating with an electromagnetic wave is heated. The term "to solidify a sol" used herein includes forming a gel by simply solidifying a sol, and additionally includes curing with a reaction in the case where raw materials for obtaining a sol have reactivity. For example, in the case where the raw material for obtaining a sol is alkoxysilanes described hereinafter or the like, a metamaterial of a gel having the electromagnetic wave resonators 52 dispersed therein can be provided by the reaction that the alkoxysilanes are cured by hydrolysis polycondensation reaction.

The raw materials for obtaining a sol are not particularly limited, and examples thereof include metal alkoxides, catalysts such as an acid or a base, and a mixture containing a solvent. Examples of the metal alkoxides include tetraethoxysilane, triethoxyphenylsilane and tetraisopropyloxy titanium.

The process for producing a metamaterial according to the fourth embodiment of the present invention may be a process of impregnating fibers with the dielectric 53 having the electromagnetic wave resonators 52 dispersed therein. In this case, a metamaterial of fibers impregnated with the electromagnetic wave resonators 52 and the dielectric 53 can be provided.

Figure 6:
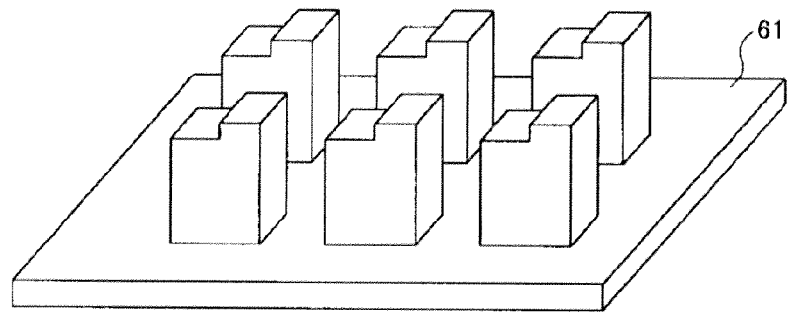
FIGS. 6(a) to (d) are views explaining a process for producing a metamaterial according to a fifth embodiment of the present invention.
Figure 6:
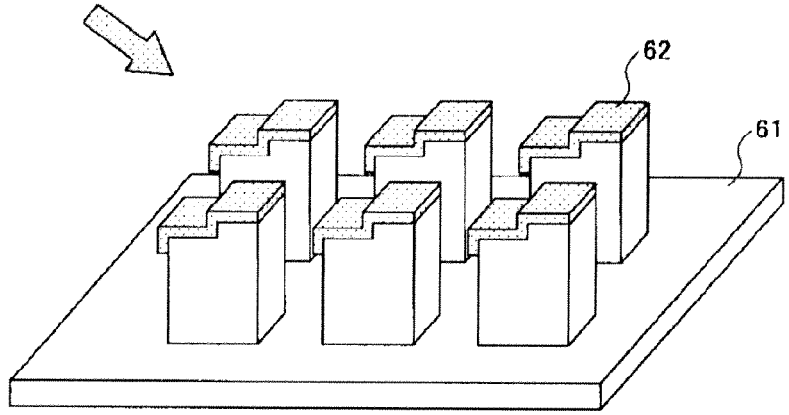
Figure 6:
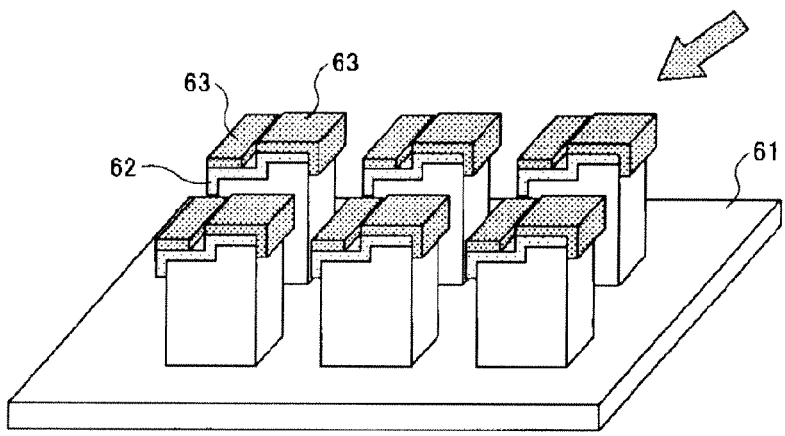
Figure 6:
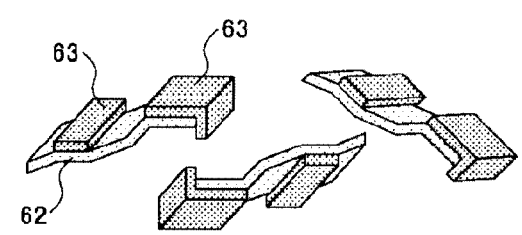

FIGS. 6(*a*) to (*d*) are views explaining a process for producing a metamaterial according to a fifth embodiment of the present invention. FIG. 6(*a*) is a view explaining a support in the process for producing a metamaterial according to the fifth embodiment of the present invention. FIG. 6(*b*) is a view explaining a first step in the process for producing a metamaterial according to the fifth embodiment of the present invention. FIG. 6(*c*) is a view explaining a second step in the process for producing a metamaterial according to the fifth embodiment of the present invention. FIG. 6(*d*) is a view explaining electromagnetic wave resonators in the process for producing a metamaterial according to the fifth embodiment of the present invention.

As shown in FIG. 6(*a*), in the process for producing a metamaterial according to the fifth embodiment of the present invention, a support 61 for supporting electromagnetic wave resonators is prepared using, for example, a nanoimprint method. The support 61 as shown in FIG. 6(*a*) has a shape of two flat surfaces having a difference in level therebetween, corresponding to a shape of two flat plates having fine gap of the electromagnetic wave resonators provided therebetween. The support 61 is, for example, composed of a fluorine resin.

Next, as shown in FIG. 6(*b*), in the process for producing a metamaterial according to the fifth embodiment of the present invention, a dielectric 62 is vapor-deposited to the support 61 having a shape corresponding to the shape of the electromagnetic wave resonators 63 using the means of physical vapor deposition. Supply source supplying the dielectric 62 is arranged to the side facing two flat surfaces and a flat surface of a difference in level between the two flat surfaces, of the support 61. The dielectric 62 supplied from the supply source is vapor-deposited to at least the two flat surfaces and the flat surface of a difference in level between the two flat surfaces, of the support 61. The dielectric 62 is supplied toward the support 61 from an oblique direction to a normal line of two flat surfaces of the support 61. Thus, a continuous film of the electric 62 covering two flat surfaces and the flat surface of a difference in level between the two flat surfaces, of at least the support 61 is provided. The film of the dielectric 62 has a shape of two flat surfaces corresponding to the shape of two flat surfaces of the support 61.

As shown in FIG. 6(*c*), in the process for producing a metamaterial according to the fifth embodiment of the present invention, a material of the electromagnetic wave resonators 63 is vapor-deposited to the film of the dielectric 62 provided on the support 61 using, for example, the means of physical vapor deposition. Supply source supplying a material of the electromagnetic wave resonators 63 is arranged to the side opposite to the surface facing two flat surfaces and the flat surface of a difference in level between the two flat surfaces, of the support 61. The material of the electromagnetic wave resonators 63 supplied from the supply source is vapor-deposited to the at least two flat surfaces of the film of the dielectric 62. The material of the electromagnetic wave resonators 63 is supplied toward the film of the dielectric 62 from an oblique direction to a normal line of the two flat surfaces of the film of the dielectric 62. As a result, the material of the electromagnetic wave resonators 63 is vapor-deposited to two flat surfaces of the film of the dielectric 62, but is not vapor-deposited to a portion of the film of the dielectric 62 in the vicinity of the flat surface of a difference in level of the support 61. Thus, the electromagnetic wave resonator 63 having a shape of two flat plates having fine gap provided therebetween is formed on the continuous film of the dielectric 62 provided on the support 61.

In other words, a metamaterial including the support 61, the film of the dielectric 62 and the electromagnetic wave resonators 63 can be produced.

Thus, in the process for producing a metamaterial according to the fifth embodiment of the present invention as shown in FIG. 6(*b*) and FIG. 6(*c*), vapor deposition of the material of the electromagnetic wave resonators 63 to the support 61 includes the vapor deposition of the dielectric 62 to the support 61 and the vapor deposition of the material of the electromagnetic wave resonators 63 to the dielectric 62.

For example, a laminate of the film of the dielectric 62 and the electromagnetic wave resonator 63 composed of a conductive material, as shown in FIG. 6(*d*), can be provided.

In this case, as shown in FIG. 6(*d*), a metamaterial including the dielectric 62 and the electromagnetic wave resonators 63 can be provided. Furthermore, even when the electromagnetic wave resonator 63 includes a plurality of constituent parts, a plurality of the constituent parts of the electromagnetic wave resonator 63 can be integrated by the dielectric 62.

As shown in FIG. 6(*a*), FIG. 6(*b*) and FIG. 6(*c*), in the process for producing a metamaterial according to the fifth embodiment of the present invention, the support 61 has a shape including a flat surface corresponding to the shape of the electromagnetic wave resonator 63. On the other hand, the dielectric 62 is vapor-deposited to the flat surface of the support 61 from a first oblique direction to a normal line of the flat surface of the support 61 and, additionally, the material of the electromagnetic wave resonator 63 is vapor-deposited to the dielectric 62 from a second oblique direction that is opposite to the first oblique direction to a normal line of the flat surface of the support 61.

In this case, various metamaterials including the dielectric 62 and the electromagnetic wave resonator 63 can be provided by adjusting conditions for the vapor-deposition of the dielectric 62 to the flat surface of the support 61 and conditions for the vapor-deposition of the material of the electromagnetic wave resonator 63 to the dielectric 62.

The electromagnetic wave resonator 63 as shown in FIG. 6(d) has a shape constituting a kind of LC circuit. As shown in FIG. 6(d), in the process for producing a metamaterial according to the fifth embodiment of the present invention, the shape of the electromagnetic wave resonators 63 is a shape of two flat plates having a fine gap provided therebetween. Thus, the shape of the electromagnetic wave resonators 63 has a shape of two flat plates through a gap such that the electromagnetic wave resonator 63 has capacitance. The electromagnetic wave resonators 63 shown in FIG. 6(d) have a gap between two flat plates held by the dielectric 62. Furthermore, the shape of the electromagnetic wave resonators 63 has a structure capable of forming a loop by conduction current and displacement current such that the electromagnetic wave resonators 63 have inductance. The electromagnetic wave resonators 63 shown in FIG. 6(d) have a structure capable of forming a loop by semi-looped conduction current flowing through one flat plate, semi-looped conduction current flowing through the other flat plate, and displacement current generated in a gap between the two flat plates and integrated to semi-looped conduction currents flowing through two flat plates.

The material of the electromagnetic wave resonators 63 may be a conductive material such as a metal or a conductive compound, and may be a dielectric. In the process for producing a metamaterial according to the fifth embodiment of the present invention, the material of the electromagnetic wave resonators 63 is preferably a dielectric. In this case, loss of high-frequency electromagnetic wave passing the metamaterial containing the electromagnetic wave resonators 63 can be reduced.

The electromagnetic wave resonators 63 as shown in FIG. 6(d) may be a fine electromagnetic wave resonator having a size of approximately millimeter or less. In this case, resonance frequency of the electromagnetic wave resonators 63 generally falls within a range of a frequency of visible light. For this reason, the relative permeability, refractive index and dispersion of a metamaterial to a wavelength of visible light can be controlled.

In the fifth embodiment of the present invention as shown in FIG. 6(c), the electromagnetic wave resonators 63 are regularly arranged on the support 61. However, sometimes the electromagnetic wave resonators 63 are irregularly (randomly) arranged in a metamaterial as shown in FIG. 6(d). In the case where the electromagnetic wave resonators 63 are irregularly (randomly) arranged in a metamaterial, for example, a metamaterial having physical properties (for example, relative permeability, refractive index and dispersion) isotropic to a polarization direction of an electromagnetic wave can be provided.

FIGS. 7(a) to (e) are views explaining a process for producing a metamaterial according to a sixth embodiment of the present invention. FIG. 7(a) is a view explaining a support in the process for producing a metamaterial according to the sixth embodiment of the present invention. FIG. 7(b) is a view explaining a first step in the process for producing a metamaterial according to the sixth embodiment of the present invention. FIG. 7(c) is a view explaining a second step in the process for producing a metamaterial according to the sixth embodiment of the present invention. FIG. 7(d) is a view explaining a third step in the process for producing a metamaterial according to the sixth embodiment of the present invention. FIG. 7(e) is a view explaining a metamaterial in the process for producing a metamaterial according to the sixth embodiment of the present invention.

As shown in FIG. 7(a), in the process for producing a metamaterial according to the sixth embodiment of the present invention, a support 71 for supporting electromagnetic wave resonators is prepared using, for example, a nanoimprint method. The support 71 as shown in FIG. 7(a) has a shape of a U-shaped convex curved surface corresponding to a curved surface shape of the U-shaped electromagnetic wave resonators. The support 71 is, for example, composed of a fluorine resin.

As shown in FIG. 7(b), in the process for producing a metamaterial according to the sixth embodiment of the present invention, a material of the electromagnetic wave resonators 72 is vapor-deposited to the support 71 having a shape corresponding to the shape of the electromagnetic wave resonators 72 resonating with an electromagnetic wave using, for example, the means of physical vapor deposition. Supply source supplying the material of the electromagnetic wave resonators 72 is arranged to the side of a first direction that is an oblique direction to a flat surface of the support 71. The material of the electromagnetic wave resonators 72, supplied from the supply source, is vapor-deposited to a part of the U-shaped convex curved surface of the support 71. Thus, a part of the electromagnetic wave resonators 72 is provided on the part of the U-shaped convex curved surface of the support 71.

As shown in FIG. 7(c), in the process for producing a metamaterial according to the sixth embodiment of the present invention, the material of the electromagnetic wave resonators 72 is vapor-deposited to the support 71 having a shape corresponding to the shape of the electromagnetic wave resonators 72 using, for example, the means of physical vapor deposition. Supply source supplying the material of the electromagnetic wave resonators 72 is arranged to the side of a second direction that is an oblique direction to the flat surface of the support 71. The second direction is a direction different from the first direction. The material of the electromagnetic wave resonators 72 supplied from the supply source is vapor-deposited to an undeposited part of the U-shaped convex curved surface of the support 71. Thus, the electromagnetic wave resonators 72 are provided on the undeposited part of the U-shaped convex curved surface of the support 71.

As a result, a metamaterial containing the support 71 and the electromagnetic wave resonators 72 covering the whole of the U-shaped convex curved surface of the support 71 can be produced. In this case, from the relationship with a direction of obliquely vapor-depositing to a position of a projection of the support, only a part of the support is vapor-deposited, and root and bottom of the projection can be avoided from the attachment of a deposit by vapor deposition. This is an excellent point in productivity of this process. In other words, because the deposit is attached to only the portion of the electromagnetic wave resonators that develop resonance function, an etching step used in the conventional lithography becomes unnecessary, and productivity can remarkably be improved.

Thus, in the process for producing a metamaterial according to the sixth embodiment of the present invention as shown in FIG. 7(b) and FIG. 7(c), the material of the electromagnetic wave resonators 72 is vapor-deposited to the support 71 from the first direction and the second direction different from first direction.

The material of the electromagnetic wave resonators 72 is vapor-deposited to the support 71 from the first direction and the second direction different from the first direction by, for example, changing a position and/or an angle of the supply source of the material of the electromagnetic wave resonators 72 to the support 71.

In this case, the material of the electromagnetic wave resonators 72 can further precisely be vapor-deposited to the support 71 by further appropriately selecting the first direction and the second direction.

Figure 7:
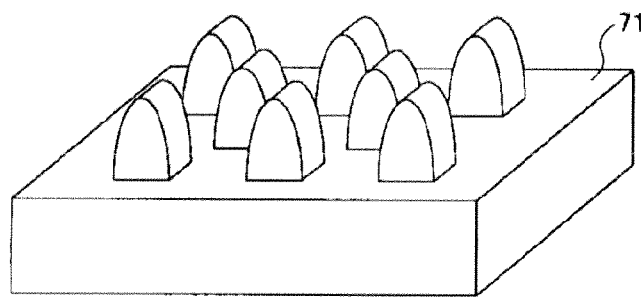
FIGS. 7(a) to (e) are views explaining a process for producing a metamaterial according to a sixth embodiment of the present invention.
Figure 7:
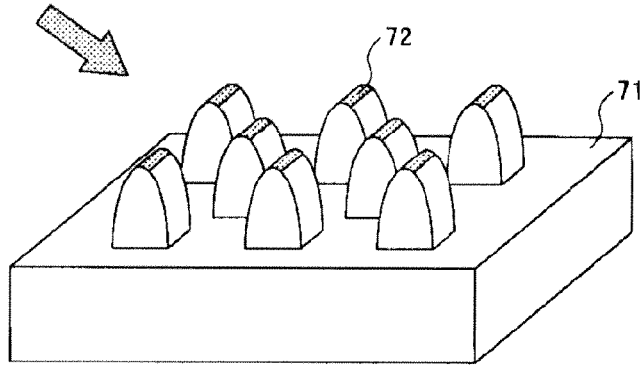
Figure 7:
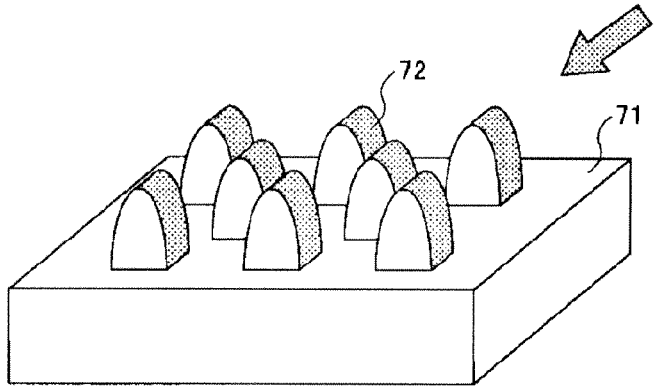
Figure 7:
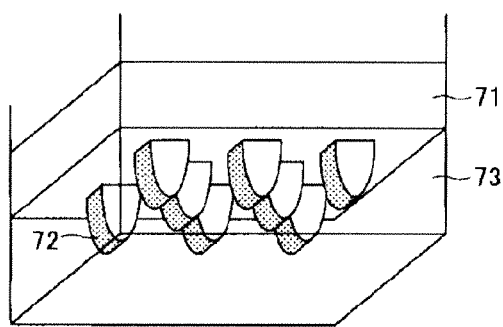
Figure 7:
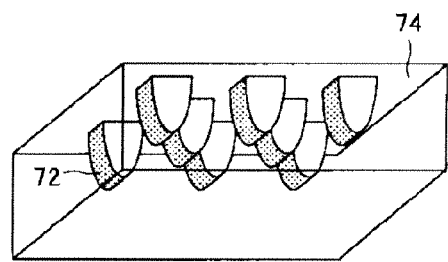

The electromagnetic wave resonators 72 as shown in FIG. 7($c$) have a shape constituting a kind of LC circuit. As shown in FIG. 7($c$), in the process for producing a metamaterial according to the sixth embodiment of the present invention, the electromagnetic wave resonators 72 have the U-shaped curved surface shape. In this way, the electromagnetic wave resonators have the U-shaped curved surface shape such that the electromagnetic wave resonators 72 have capacitance. The electromagnetic wave resonators 72 shown in FIG. 7($c$) have a gap between both end parts of the U-shaped curved surface. The shape of the electromagnetic wave resonators 72 has a structure capable of forming a loop by conduction current and displacement current such that the electromagnetic wave resonators 72 have inductance. The electromagnetic wave resonators 72 shown in FIG. 7($c$) have a structure capable of forming a loop by conduction current flowing from one end part of the U-shaped curved surface to the other end part thereof and displacement current generated in a gap between both end parts of the U-shape.

The material of the electromagnetic wave resonators 72 may be a conductive material such as a metal or a conductive compound, and may be a dielectric. In the process for producing a metamaterial according to the sixth embodiment of the present invention, the material of the electromagnetic wave resonator 72 is preferably a dielectric. In this case, loss of a high-frequency electromagnetic wave passing through a metamaterial containing the electromagnetic wave resonators 72 can be reduced.

The electromagnetic wave resonators 72 as shown in FIG. 7($c$) may be a fine electromagnetic wave resonator having a size of approximately millimeter or less. In this case, resonance frequency of the electromagnetic wave resonators 72 falls within a range of a frequency of visible light. For this reason, relative permeability/refractive index/dispersion of a metamaterial to a wavelength of visible light can be controlled.

In the sixth embodiment of the present invention shown in FIG. 7($c$), the electromagnetic wave resonators 72 are regularly arranged on the support 71. However, sometimes the electromagnetic wave resonators 72 are irregularly (randomly) arranged in the metamaterial. In the case where the electromagnetic wave resonators 72 are irregularly (randomly) arranged in the metamaterial, for example, a metamaterial having physical properties (for example, relative permeability, refractive index and dispersion) isotropic to a direction of polarization of an electromagnetic wave can be provided.

In the process for producing a metamaterial according to the sixth embodiment of the present invention, for example, as shown in FIG. 7($d$), a curable resin 73 is brought into contact with the electromagnetic wave resonator 72 provided on the support 71, and the curable resin 73 is cured.

As shown in FIG. 7($e$), the support 71 is removed from a cured product 74 of a resin obtained by curing the curable resin 73. As a result, a metamaterial including the cured product 74 of a resin and electromagnetic wave resonators 72 can be obtained. Thus, the electromagnetic wave resonators 72 can be transferred to the cured product 74 of a resin.

Figure 8:
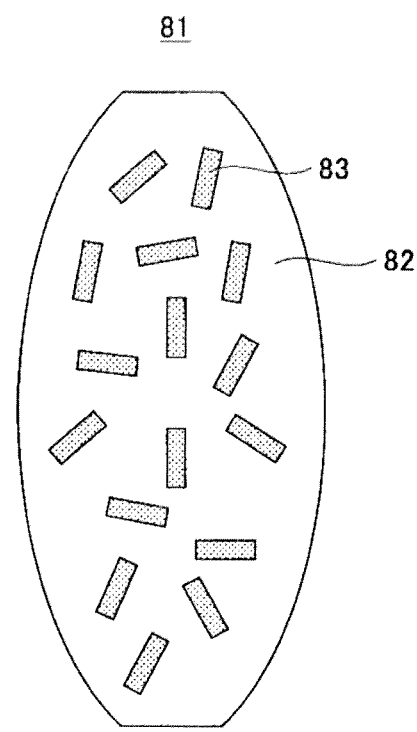
FIG. 8 is a view explaining an example of a metamaterial produced according to the embodiment of the present invention.

FIG. 8 is a view explaining an example of a metamaterial produced by the embodiment(s) of the present invention. A metamaterial 81 shown in FIG. 8 is an optical element including a cured product 82 of a resin and electromagnetic wave resonators 83. The metamaterial 81 shown in FIG. 8 is a lens. In the metamaterial 81, the electromagnetic wave resonators 83 are irregularly (randomly) dispersed in the cured product 82 of a resin. For this reason, the metamaterial 81 is, for example, a lens having physical properties (for example, relative permeability, refractive index and dispersion) isotropic to a polarization direction of an electromagnetic wave. Furthermore, a lens having adjusted isotropic physical properties (for example, relative permeability, refractive index and dispersion) can be provided by appropriately designing the electromagnetic wave resonators 83 dispersed in the cured product 82 of a resin.

Examples

Figure 9:
FIG. 9 is a transmission electron microscope photograph showing a cross-sectional shape of a metamaterial produced by a sixth embodiment of the present invention.

FIG. 9 is a photograph when a quartz glass mold was used, projection structure was transferred to a fluorine-based UV photocured resin (NIF-A-2, manufactured by Asahi Glass Co., Ltd.) using a nanoimprint apparatus, Al was coated thereon by oblique vapor deposition from two directions, followed by embedding with epoxy resins in order to inhibit a sample from receiving a damage during the preparation of a sample for a cross-sectional observation, and then, the sample which had been sliced by microtome was observed by TEM. The projection of the fluorine-based UV cured resin had 100 nm square pillars of approximately 400 nm height, but was slightly shrunk due to a heat during Al coating. The U-shaped Al resonators, which were observed darkly in the photograph, were able to be formed.

Figure 10:
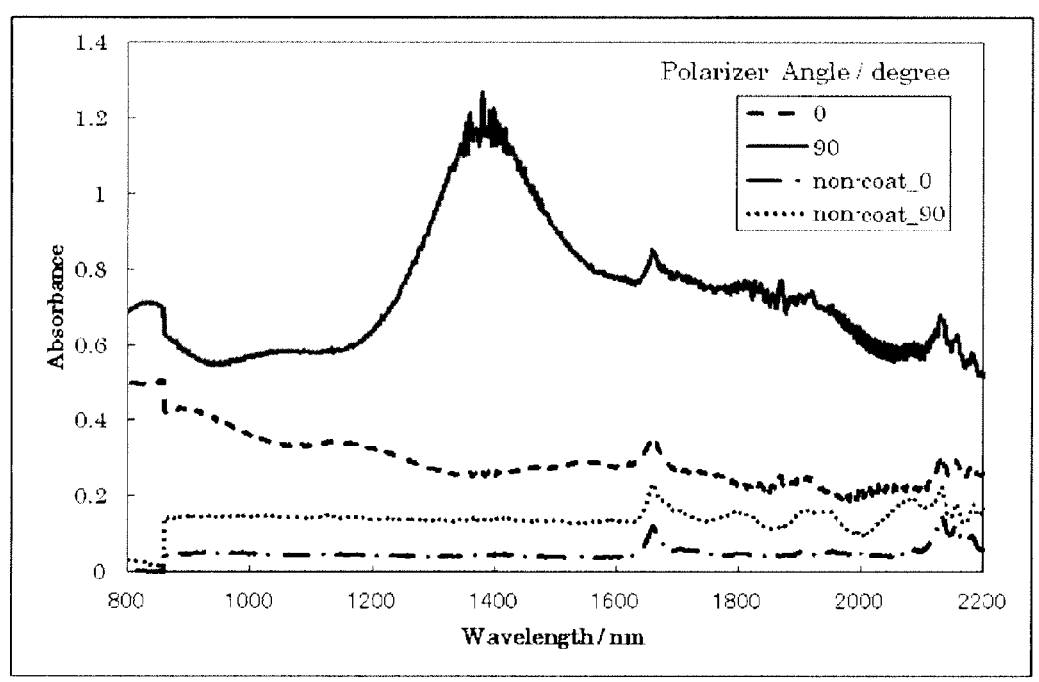
FIG. 10 is a view showing absorbance measurement results of a metamaterial produced according to a sixth embodiment of the present invention.

FIG. 10 shows the results that regarding a sample prepared by the same preparation method as the Al resonator of FIG. 9 and a sample obtained by subjecting a fluorine-based UV photocured resin (NIF-A-2, manufactured by Asahi Glass Co., Ltd.) to nanoimprint, but not subjecting to Al coating, absorbance was measured by changing a polarization direction 90°. It was confirmed in the sample having been subjected to Al coating that in the case of entering light in a direction that magnetic field penetrates through the resonator, resonance absorption could be observed at a center wavelength of about 1,400 nm, and a structure that functions in the wavelength region could be formed.

Figure 11:
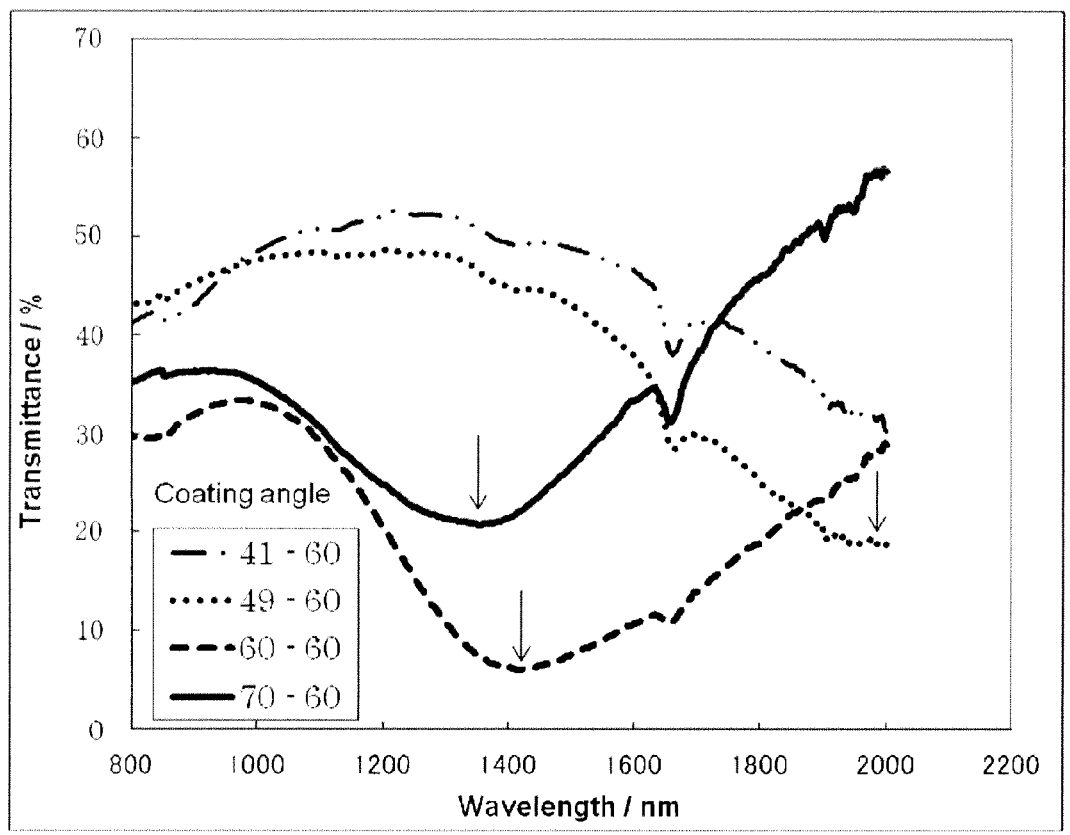
FIG. 11 is a view showing spectral transmission measurement results of a metamaterial produced according to a sixth embodiment of the present invention.
Figure 12:
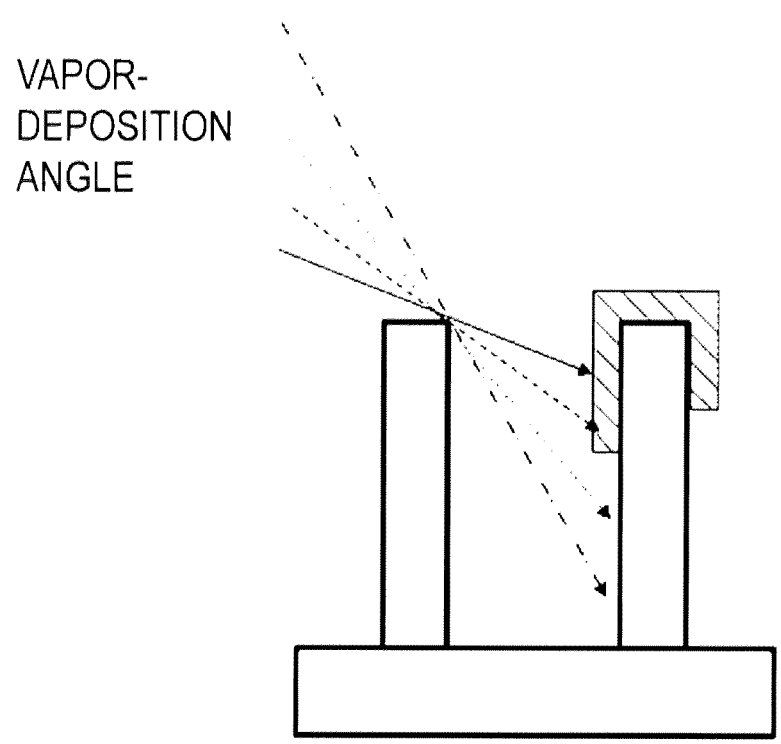
FIG. 12 is a view explaining oblique vapor-deposition in the process for producing a metamaterial according to a sixth embodiment of the present invention.

FIG. 11 shows a transmission spectrum when oblique vapor deposition of Al has been conducted to coat by changing vapor deposition angle as shown in FIG. 12, in preparing a resonator structure by the same preparation method as the preparation of the Al resonator shown in FIG. 9. The legends in the graph mean that when the case of vertically coating to a transferred surface of a UV cured resin is 0° as an angle of oblique vapor deposition, for example, in the indication of 41-60, oblique vapor deposition is first conducted from a direction of 41°, and oblique vapor deposition is then conducted at 60° from a direction opposite to the angle. As shown by an arrow in FIG. 11, it is seen that resonance absorption band can be changed by changing an angle of oblique vapor deposition. It is predicted that a resonance absorption band of a curve shown by 41-60 appears at further long wavelength side of this graph from the relationship with a shape of the other curves.

Figure 13:
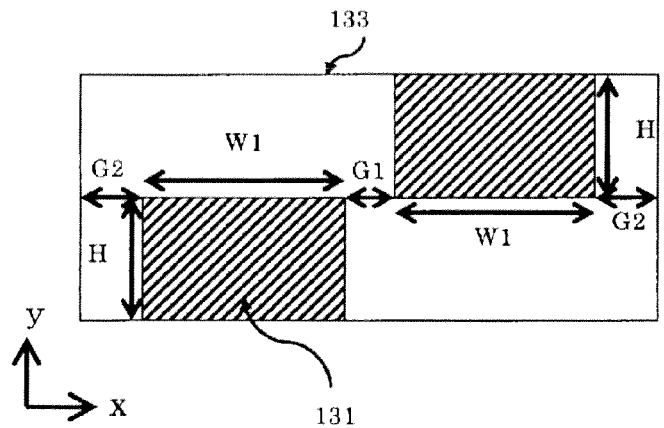
FIGS. 13(a) to (c) are views explaining a unit cell of electromagnetic field analytical model of a metamaterial according to a sixth embodiment of the present invention.
Figure 13:
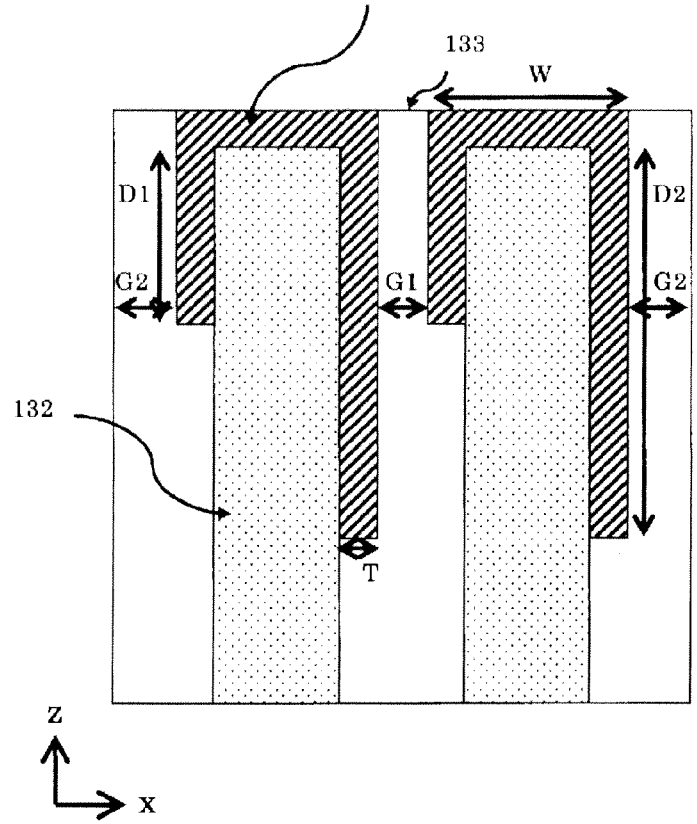
Figure 13:
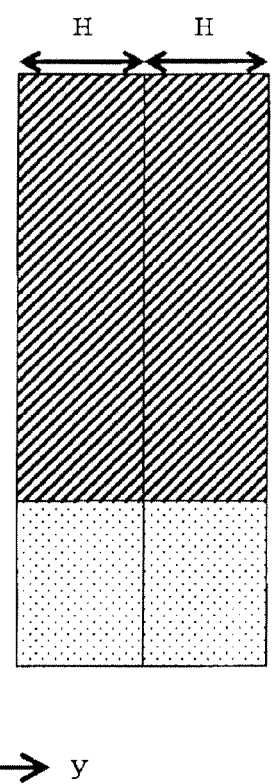

FIGS. 13(a) to (c) show a unit cell used when, of the opened quadrilateral-shaped electromagnetic wave resonators, electromagnetic wave resonators showing negative values of both permeability and permittivity in the same frequency band by making a length of one side longer than that of the other side were analyzed by three-dimensional electromagnetic field analysis. The analysis results are the results to electromagnetic wave resonators in which the unit cells were periodically arranged unlimitedly in x-direction and y-direction.

Figure 14:
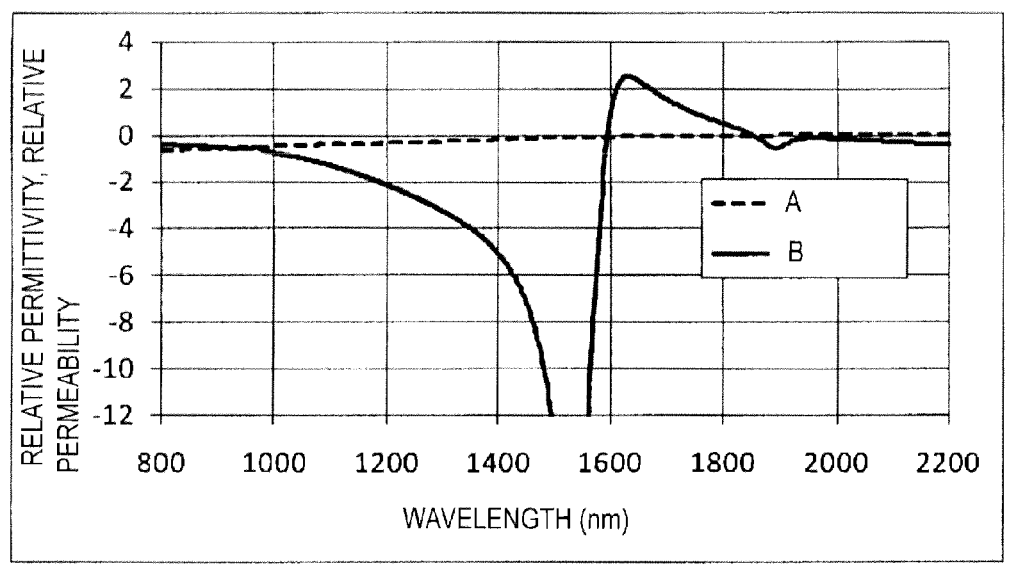
FIG. 14 is a view explaining electromagnetic field analytical results of a metamaterial according to a sixth embodiment of the present invention.

As an example of the analysis carried out, a conductor 131 used was Al, and a support 132 used was a dielectric having a permittivity of 2. The electromagnetic wave entering was a plane wave and vertically entered z plane. Direction of electric field of the plane wave was x-direction, and direction of magnetic field was y-direction. The respective dimensions of the electromagnetic wave resonators are that the Al has width W1=160 nm, height H=100 nm, depth D1=173 nm, D2=346 nm, and thickness T=30 nm, and the support has depth D3=450 nm, width W2=100 nm, and gaps G1 of opened quadrilateral shape structure=40 nm and G2=50 nm. The results analyzed are shown in FIG. 14. It is seen that both the relative permittivity and the relative permeability show negative values in the vicinity of from 800 to 1,600 nm.

Although the embodiments of the present invention have been specifically described above, the present invention is not limited by those embodiments, and those embodiments can be modified, changed and/or combined without departing the gist and scope of the present invention.

While the invention has been described in detail and with reference to specific embodiments thereof, it will be apparent to one skilled in the art that various changes and modifications can be made therein without departing from the spirit and scope thereof.

This application is based on Japanese Patent Application No. 2010-160956 filed on Jul. 15, 2010, the entire subject matter of which is incorporated herein by reference.

INDUSTRIAL APPLICABILITY

According to one aspect of the present invention, a process for producing a metamaterial more efficiently can be provided. In addition, by utilizing the advantage in the aspect, a metamaterial realizing a negative refraction index can be realized.

DESCRIPTION OF REFERENCE NUMERALS AND SIGNS

11, 32, 61, 71: Support
12, 34, 42, 52, 63, 72, 83: Electromagnetic wave resonator resonating with electromagnetic wave
13, 35, 81: Metamaterial
21: Apparatus for evaluating properties of resonance
22: Sample
23: Light source
24: Polarizing plate
25: Spectrophotometer
31: Apparatus for producing metamaterial
33, 41, 51: Material having adhesiveness
36: Pressure roller
43: Heater
53: Dielectric
62: Dielectric
73: Curable resin
74, 82: Cured product of resin
131: Conductor
132: Support
133: Unit cell of analysis model

The invention claimed is:

1. A process for producing a metamaterial comprising an electromagnetic wave resonator resonating with an electromagnetic wave, the process comprising:
    forming, by nanoimprinting, a support having a shape corresponding to a shape of the electromagnetic wave resonator wherein the electromagnetic wave resonator has an approximate opened quadrilateral shape or approximate U-shape, and the approximate opened quadrilateral shape or approximate U-shape has two end parts differing in length; and
    vapor-depositing a material which can form the electromagnetic wave resonator to the support to thereby arrange the electromagnetic wave resonator on the support, wherein the material which can form the electromagnetic wave resonator is vapor-deposited to the support from two or more different directions.

2. The process for producing a metamaterial according to claim 1, wherein the material which can form the electromagnetic wave resonator is vapor-deposited by a physical vapor deposition to thereby arrange the electromagnetic wave resonator on the support.

3. The process for producing a metamaterial according to claim 1, wherein the support has a shape having a convex curved surface corresponding to the shape of the electromagnetic wave resonator, and the material which can form the electromagnetic wave resonator is vapor-deposited to the convex curved surface of the support.

4. The process for producing a metamaterial according to claim 1, wherein a dielectric is vapor-deposited to the support, and a conductive material and/or a dielectric is further vapor-deposited thereto.

5. The process for producing a metamaterial according to claim 4, wherein the support has a plurality of flat surfaces, and the plurality of flat surfaces have a difference in level each other.

6. The process for producing a metamaterial according to claim 1, wherein a material of the support is a material permeable to the electromagnetic wave.

7. The process for producing a metamaterial according to claim 1, wherein the electromagnetic wave resonator which has been transferred to a material having adhesiveness is laminated, followed by integrating.

8. The process for producing a metamaterial according to claim 1, wherein the electromagnetic wave resonator which has been provided on the support is transferred to a material having adhesiveness, and then, the electromagnetic wave resonator is separated from the support to be thereby recovered.

* * * * *